(12) United States Patent
Huang et al.

(10) Patent No.: US 6,514,778 B2
(45) Date of Patent: Feb. 4, 2003

(54) METHOD FOR MEASURING EFFECTIVE GATE CHANNEL LENGTH DURING C-V METHOD

(75) Inventors: Heng-Seng Huang, Taipei (TW); Gary Hong, Hsin-Chu (TW); Yue-Shiun Lee, Taipei (TW); Shyh-Jye Lin, Taipei (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/774,773

(22) Filed: Jan. 31, 2001

(65) Prior Publication Data

US 2002/0102752 A1 Aug. 1, 2002

(51) Int. Cl.$^7$ .......................... H01L 21/66; G01R 31/26
(52) U.S. Cl. ........................ 438/17; 438/18; 438/585
(58) Field of Search ....................... 438/17, 18, 585, 438/FOR 142, FOR 143, FOR 191

(56) References Cited

U.S. PATENT DOCUMENTS

| | | | | |
|---|---|---|---|---|
| 4,824,804 A | * | 4/1989 | Cheng | 148/DIG. 65 |
| 5,313,076 A | * | 5/1994 | Yamazaki et al. | 257/347 |
| 5,821,766 A | * | 10/1998 | Kim et al. | 324/765 |
| 6,210,999 B1 | * | 4/2001 | Gardner et al. | 257/332 |
| 6,327,555 B1 | * | 12/2001 | Shimizu et al. | 700/110 |

OTHER PUBLICATIONS

Olsson J. et al., "A Capacitance–Voltage Measurement Method for DMOS Transistor Channel Length Extraction", IEEE 1999 Int. Conf. on Microelectronics Test Structures, vol. 12, Mar. 1999, pp. 135–140.*

Wang, Chih Hsin, "Identification and Measurement of Scaling–Dependent Parasitic Capacitances of Small–Geometry MOSFET's", IEEE Transactions on Electron Devices, vol. 43, No. 6, Jun. 1996, pp. 965–972.*

Flandre D. et al., "Characterization of SOI MOsfet's by Gate Capacitance Measurements", Proc. IEEE Int. Conference on Microelectronics Test Structures, vol. 6, Mar. 1993, pp. 283–287.*

* cited by examiner

*Primary Examiner*—Wael Fahmy
*Assistant Examiner*—Michelle Estrada
(74) *Attorney, Agent, or Firm*—Powell Goldstein; Frazer & Murphy LLP

(57) ABSTRACT

The present invention provides a C-V method for measuring an effective channel length in a device, which can simultaneously measure a gate-to-drain overlap length and a gate etch bias length in the device. In the present method, the measured length of the gate by using the present method has a deviation below 5% compared with the real gate length form SEM. Furthermore, the calculating method of the present invention only uses simple simultaneous equations, which can be measured by a man or a mechanism. As the layout rule shrunk, the present method provides a simple way to measure those parameters, which have become more and more important in the device.

3 Claims, 5 Drawing Sheets

METHOD FOR MEASURING EFFECTIVE GATE CHANNEL LENGTH DURING C-V METHOD

BACKGROUND OF THE INVENTION

1. Field of the Invention

The present invention generally relates to a method for measuring an effective gate channel length, and more particularly relates to a method for measuring an effective channel length during the application of a capacitance-voltage (C-V) method.

2. Description of the Prior Art

Channel length is a key parameter in CMOS technology used for performance projection (circuit models), short-channel design, and process monitoring. It usually differs from the gate length by an amount depending on the gate lithography and the etch bias, as well as on the lateral source/drain diffusion.

In general, channel length is determined by using an I-V (current-voltage) method, which is determined from a series of linear (low-drain-bias) I-V curves of devices with different mask lengths. The channel lengths of MOSFET are becoming increasingly difficult to measure in the deep sub-micron region due to strong variation of mobility with gate voltage, more pronounced effects of graded source/drain doping profiles, and linewidth-dependent lithography bias near the optical resolution limit.

However, the general I-V method is derived for long-channel devices and is not strictly valid for short-channel devices, so an improved channel-length extraction algorithm, called the shift-and-ratio (S&R) method, is formed. The S&R method is complicated and can not calculate the length of the gate etch bias ($L_{pb}$) and the length of the gate to drain overlap ($L_{overlap}$).

Accordingly, it is obvious that the conventional method for measuring the channel length is defective and then an easy and mendable method is instantly required, especially in the scaling down of devices for measuring an effective gate channel length, a gate etch bias length, and a gate-to-drain overlap length.

SUMMARY OF THE INVENTION

An object of the invention is to use a C-V method to measure an effective gate channel length in a device.

Another object of the invention is to use a C-V method more accurately to measure a gate-to-drain overlap length and a gate etch bias length in a device.

In order to achieve the previous objects of the invention, the method of the present invention comprises the following essential steps. First, a first device is provided with a source/drain and a gate mounted on a substrate. The gate of the first device is in a predetermined length $L_1$, a predetermined width $W_1$, and a predetermined height $H_1$, wherein the predetermined width being orthogonal to the predetermined length of the gate. Next, a negative fixed voltage is applied to the gate of the first device and then a first capacitance between the gate and the source/drain of the first device is measured at the negative fixed voltage. Thereafter, a positive fixed voltage is applied to the gate of the first device and then a second capacitance between the gate and the source/drain of the first device is measured at the positive fixed voltage. Then, a gate-to-drain overlap length of the first device is determined using the measured first capacitance. Next, a gate etch bias length of the first device is determined using the measured second capacitance. Last, the effective channel length is calculated from the gate-to-drain overlap length and the gate etch bias length.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, although the embodiments illustrated herein are shown in two-dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1:
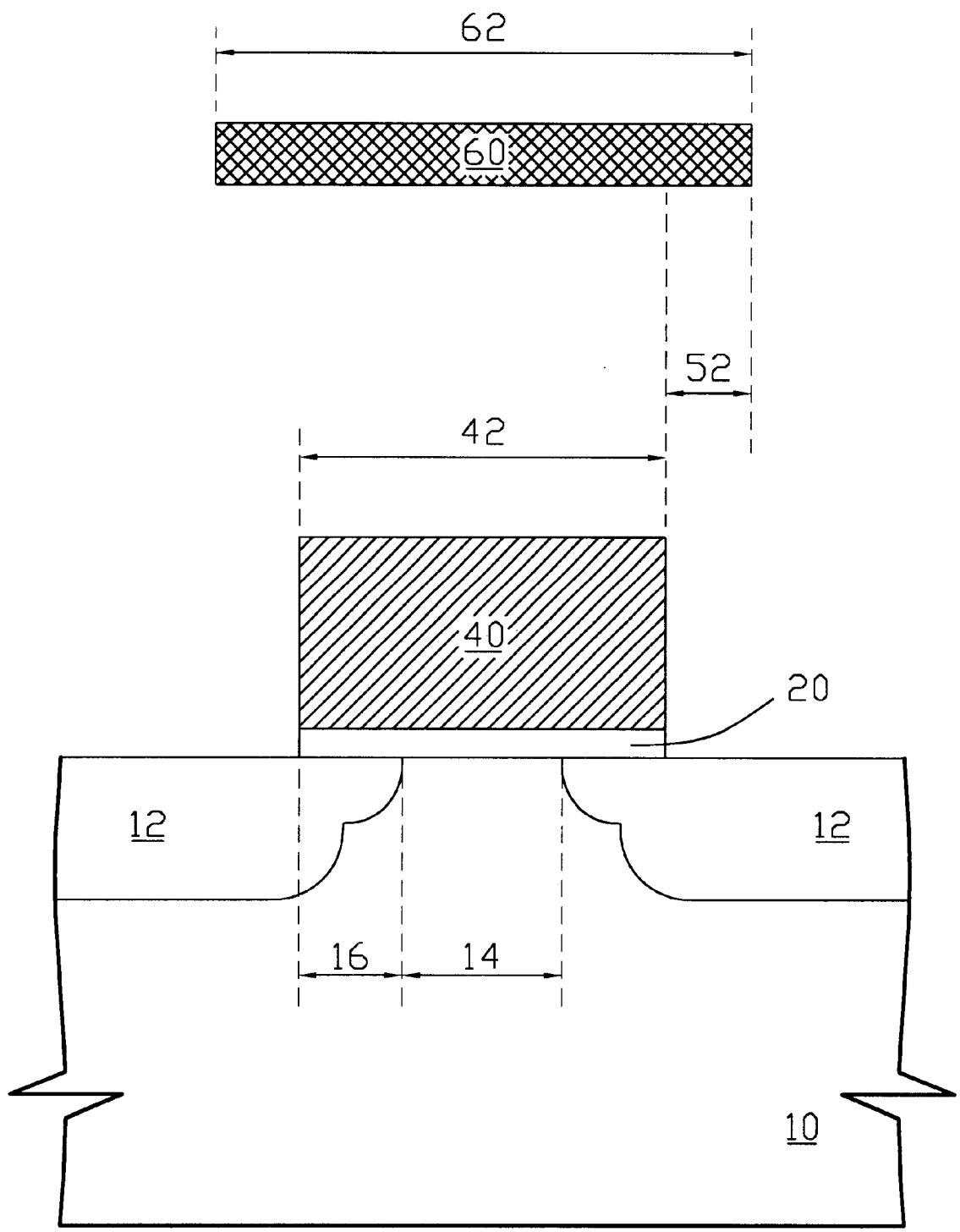
FIG. 1 is a schematic diagram showing the definition and relationship among various notions of length in a MOS device.

FIG. 1 shows schematically how various notions of length in a MOS device are defined. $L_{mask}$ 62 is a design length on a gate etch mask 60 and is reproduced on a substrate 10 as $L_{gate}$ 42 of a gate 40 through lithography and etching processes. Depending on the lithography and etching biases, $L_{gate}$ 42 can be either longer or shorter than $L_{mask}$ 62 and $L_{pb}$ is defined as a length of gate etch bias, wherein the length 52 is half gate etch bias length ($L_{pb}/2$). Although $L_{gate}$ 42 is an important parameter for process control and monitoring, there is no simple way of making a large number of measurements of it. Usually, $L_{gate}$ 42 is measured with a scanning electron microscope (SEM) and only sporadically across the wafer. With the trend of scaling down, a gate-todrain overlap length $L_{overlap}$ 16 becomes more and more important to affect the operation and performance of a MOS device and $L_{overlap}$ depends on the extension of a source/drain 12 in the substrate 10. $L_{eff}$ is defined as an effective gate channel length between the junction of the source/drain 12 and the parameter $L_{eff}$ 14 must be measured by some electrical characteristics of a MOS device. $L_{gate}$ and $L_{eff}$ can be expressed as equation (1) and equation (2)

$$L_{pb}=L_{mask}-L_{gate} \quad (1)$$

$$L_{eff}=L_{mask}-L_{pb}-2*L_{overlap} \quad (2)$$

where $L_{pb}$ is the length of gate etch bias, $L_{mask}$ is the design length on a gate etch mask, $L_{gate}$ is the length of the gate, and $L_{overlap}$ is the length of gate-to-drain overlap.

Figure 2:
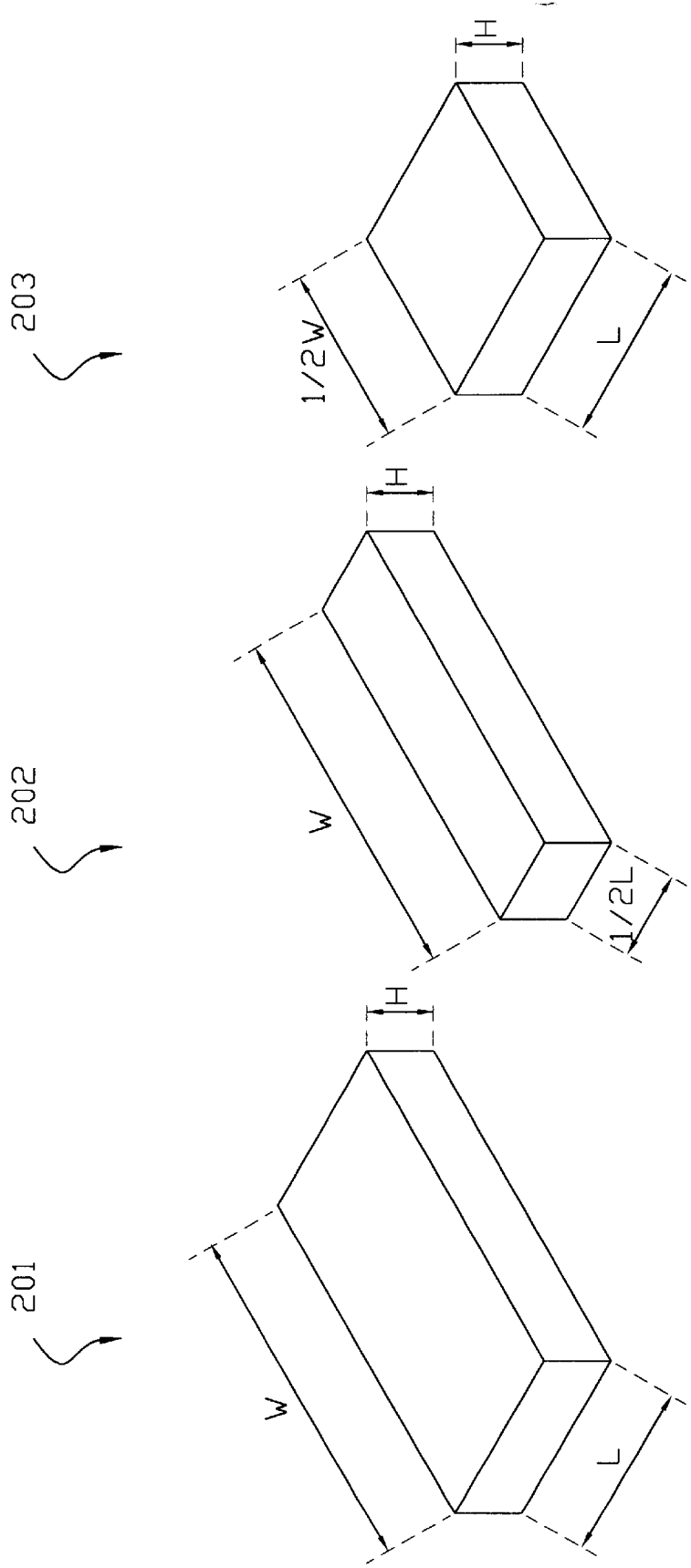
FIG. 2 is a schematic diagram showing the different predetermined dimensions of the gate of the first device, the second device, and the third device.

The method of the present invention comprises the following steps. First, a first device, a second device, and a third device are provided and each one of those devices is with a source/drain and a gate mounted on a substrate, as shown in FIG. 1. FIG. 2 is a schematic diagram showing the different predetermined dimensions of the gate of those devices. The predetermined length, the predetermined width, and the predetermined height of gates 201, 202, and 203 of the first device, the second device, and the third device $L_1$, $W_1$, $H_1$; $L_2$, $W_2$, $H_2$; and $L_3$, $W_3$, $H_3$ are L, W, H; L/2, W, H; and L, W/2, H. The first device and the second are different only in the width of the gate. The first device and the third device are different only in the length of the gate. Those devices have an intrinsic capacitance per unit width $C_{total}$ between the gate and the source/drain at a fixed voltage to the gate, wherein $C_{total}$ can be expressed as equation (3):

$$C_{total}=C_{gate}+2*C_{overlap}+2*C_{fringing}+(C_{offset}/W) \quad (3)$$

where $C_{total}$ is the intrinsic capacitance per unit width between the gate and the source/drain, $C_{gate}$ is an intrinsic gate-to-channel capacitance per unit width, $C_{overlap}$ is a gate-to-drain overlap capacitance per unit width, $C_{fringing}$ is a fringing capacitance per unit width, $C_{offset}$ is a deviation captacitance from a measuring apparatus, and W is the predetermined width of the gate. Furthermore, the fringing capacitance per unit width $C_{fringing}$ can be expressed as equation (4):

$$C_{fringing}=2*\epsilon_{oxide}/\pi*ln[1+(H_{gate}/H_{gate\ oxide})] \quad (4)$$

where $H_{gate}$ is the predetermined high of the gate, $H_{gate\ oxide}$ is the height of the gate oxide layer 20 as shown in FIG. 1, and $\epsilon_{oxide}$ is the field of the gate oxide layer. In the present method, $H_{gate}$, $H_{gate\ oxide}$, and $\epsilon_{oxide}$ are constants, so $C_{fringing}$ is also a constant.

Figure 3:
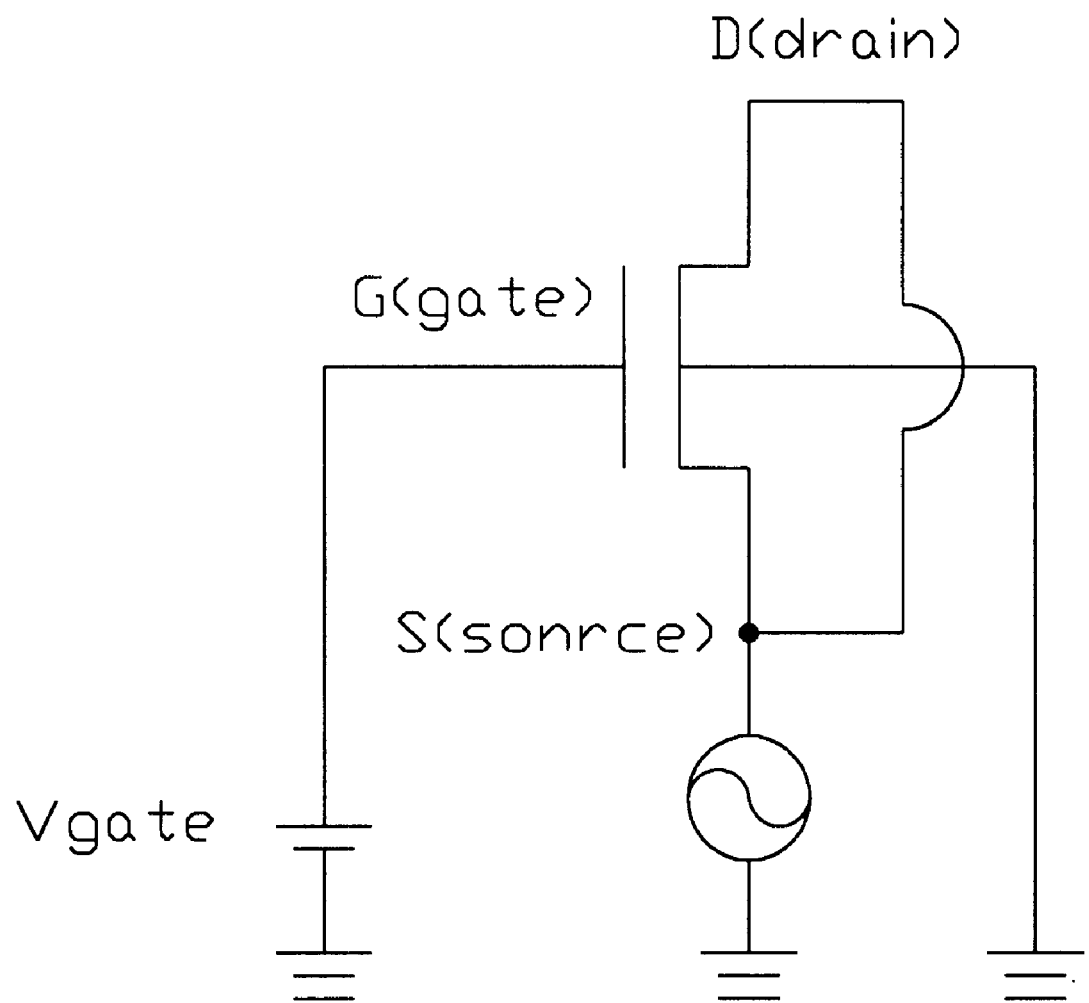
FIG. 3 is a schematic diagram showing the split C-V measurement setup.
Figure 4:
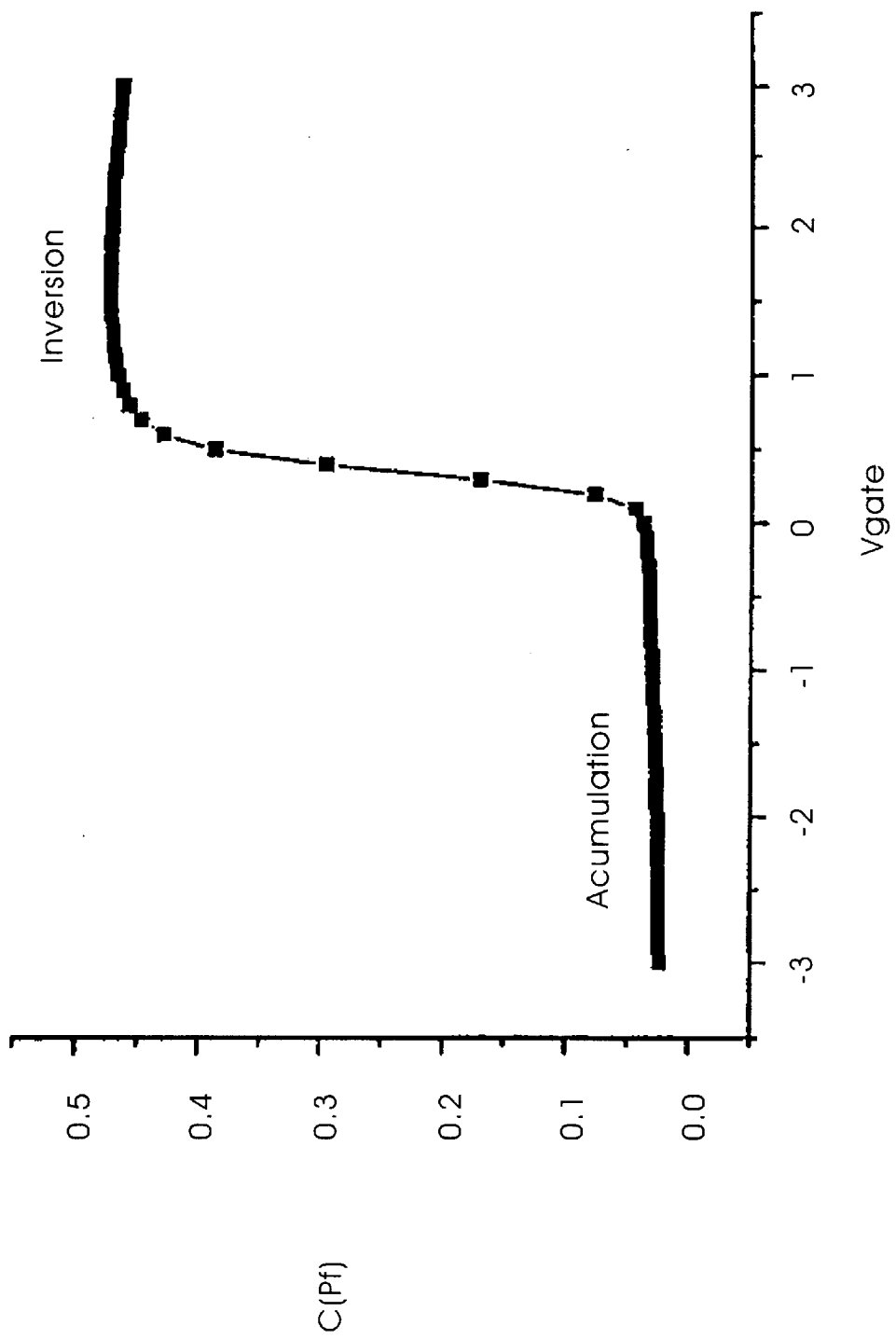
FIG. 4 is a schematic diagram showing the measured capacitance from gate to source/drain versus a voltage to a gate for a MOS device.
Figure 5:
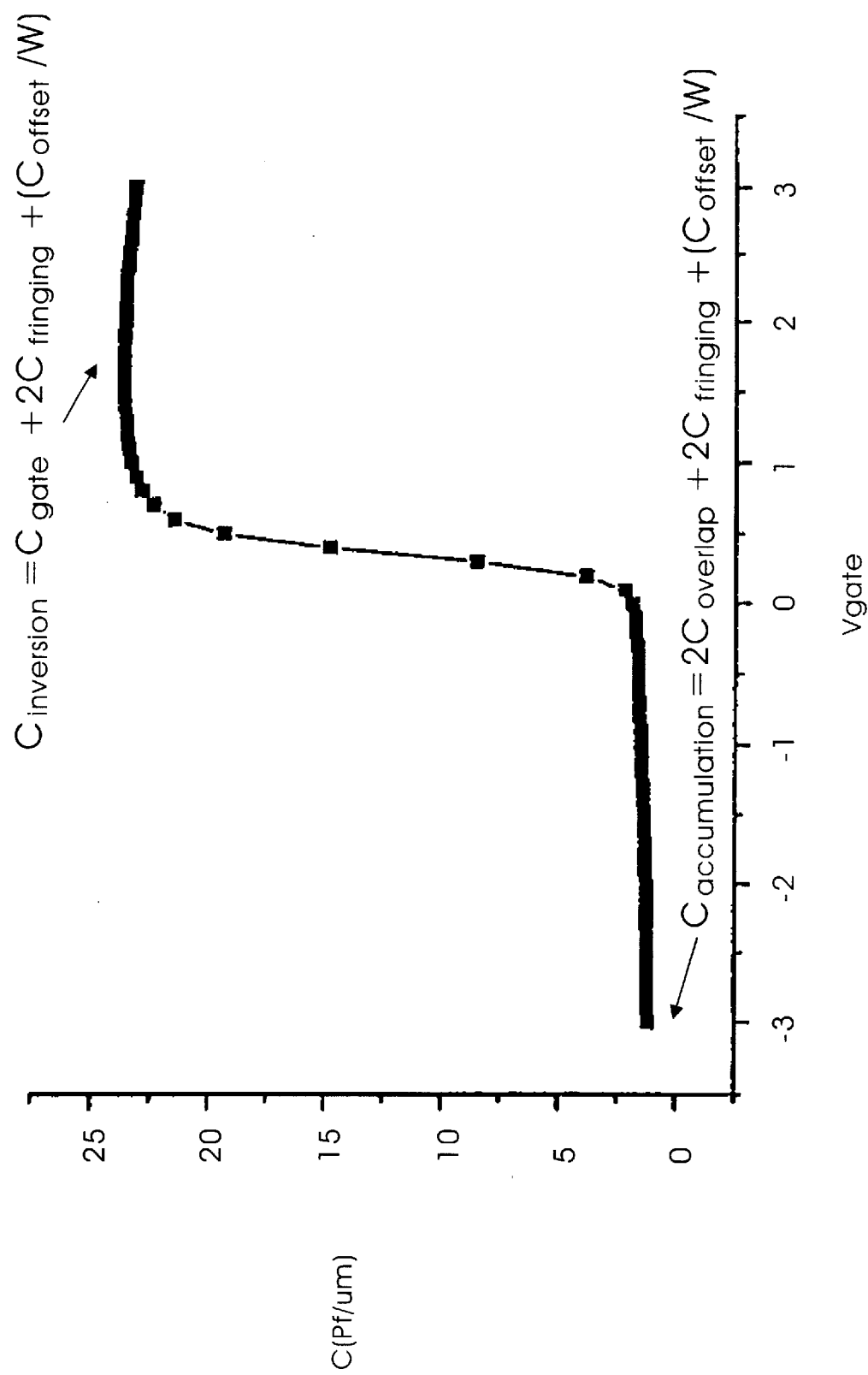
FIG. 5 is a schematic diagram showing the measured capacitance per unit width from gate to source/drain versus a voltage to a gate for a MOS device.

Next, an electrical signal testing is performed to acquire some characteristics of those devices to measure the effective channel gate length. The electrical testing, which is shown in FIG. 4, is performed in a C-V setup as shown in FIG.3. As the intrinsic capacitance per unit width $C_{total}$, at a negative fixed voltage to the gate, $C_{total}$, can be expressed as an accumulation capacitance per unit width $C_{accumulation}$, which is expressed as equation (5):

$$C_{accumulation}=2*C_{overlap}+2*C_{fringing}+(C_{offset}/W) \quad (5)$$

where $C_{accumulation}$ is an accumulation capacitance per unit width at a negative fixed voltage to the gate. Referring FIG. 5, the gate-to-drain overlap capacitance per unit width $C_{overlap}$ has very little difference at the accumulation region.

In another condition, when the intrinsic capacitance per unit width $C_{total}$ is at a positive fixed Voltage to the gate, $C_{total}$ can be expressed as an inversion capacitance per unit width $C_{inversion}$, which is expressed as equation (6):

$$C_{inversion}=C_{gate}+2*C_{fringing}+(C_{offset}/W) \quad (6)$$

where $C_{inversion}$ is an inversion capacitance per unit width at a positive fixed voltage to the gate.

Thereafter, the measuring the effective channel gate length comprises the following steps. First, a negative fixed voltage is applied to the gate of the first device and the second device. Then, a first capacitance between the gate and the source/drain of the first device $C_{accumulation,measured,1}$ and a second capacitance between the gate and the source/drain of the second device $C_{accumulation,measured,2}$ are measured at the negative fixed voltage. Next, $C_{accumulation,measured,1}$ and $C_{accumulation,measured,2}$ are put in the equation (5) to become equation (5-1) and equation (5-2):

$$C_{accumulation,1}=2*C_{overlap,1}*W_1+2*C_{fringing,1}*W_1+C_{offset,1} \quad (5-1)$$

$$C_{accumulation,measured2}=2*C_{overlap,2}*W_2+2*C_{fringing,2}*W_2+C_{offset,2} \quad (5-2)$$

where $W_1$ and $W_2$ are known and $C_{fringing,1}$ and $C_{fringing,2}$ are constant. Because $C_{overlap}$ has a very small difference at the accumulation region, $C_{overlap,1}$ and $C_{overlap,2}$ can be meant equal. However, because $C_{offset}$ is produced from the measuring apparatus, $C_{offset}$ is a constant. Thus, solving the equation (5-1) and the equation (5-2) can acquire $C_{overlap}$ and $C_{offset}$.

Furthermore, the gate-to-drain overlap length $C_{overlap}$ of the first device can be calculated according to equation (7):

$$L_{overlap}=(H_{gate\ oxide}*C_{overlap})/\epsilon_{oxide} \quad (7)$$

where $H_{gate\ oxide}$ is the height of the gate oxide layer 20 as shown in FIG. 1, and $\epsilon_{oxide}$ is the field of the gate oxide layer.

Next, a positive fixed voltage is applied to the gate of the first device and the third device. Then, a third capacitance between the gate and the source/drain of the first device $C_{inversion,measured,1}$ and a fourth capacitance between the gate and the source/drain of the second device $C_{inversion,measured,3}$ are measured at the negative fixed voltage. Next, $C_{inversion,measured,1}$ and $C_{inversion,measured,3}$ are put in the equation (6) to become equation (6-1) and equation (6-2):

$$C_{inversion,measured,1}=C_{gate,1}*W_1+2*C_{fringing,1}*W_1+C_{offset,1} \quad (6-1)$$

$$C_{inversion,measured,3}=C_{gate,3}*W_3+2*C_{fringing,3}*W_3+C_{offset,3} \quad (6-2)$$

where $W_1$ and $W_3$ are known and equal and $C_{fringing,1}$ and $C_{fringing,3}$ are constant. Thus, $C_{gate,1}$ and $C_{gate,2}$ can be acquired from the equation (6-1) and the equation (6-2). Furthermore, the length of the gate of the first device $L_{gate}$ cane be acquired from equation (8):

$$L_{gate}=(C_{gate}*W)*(L_1-L_3)/[(C_{gate1}-C_{gate,3})*W] \quad (8)$$

where $L_{gate}$ is the length of the gate of the first device; $C_{gate}$ is equal to $C_{gate,1}$; and W is equal to $W_1$ and $W_3$.

According to the following step, the gate etch bias length $L_{pb}$ can be calculated by the equation (1), where $L_{pb}=L_{mask}-L_{gate}$. Finally, the effective channel length $L_{eff}$ of the first device can be calculated by the equation (2), where $L_{eff}=L_{mask}-L_{pb}-2*L_{overlap}$.

To sum up the foregoing the present invention provides a C-V method for measuring an effective channel length in a device, which can simultaneously measure a gate-to-drain overlap length and a gate etch bias length in the device. In the present method, the measured length of the gate by using the present method has a deviation below 5% compared with the real gate length form SEM. Furthermore, the calculating method of the present invention only uses simple simultaneous equations, which can be measured by a man or a mechanism. As the layout rule shrunk, the present invention provides a simple way to measure those parameters, which have become more and more important in the device.

Of course, it is to be understood that the invention need not be limited to these disclosed embodiments. Various modifications and similar changes are still possible within the spirit of this invention. In this way, the scope of this invention should be defined by the appended claims.

What is claimed is:

1. A method for measuring an effective channel length during a capacitance-voltage (C-V) method, said method comprising:

providing a first device comprising a first gate electrode, a first source and a first drain, a second device comprising a second gate electrode, a second source and a second drain, wherein said first gate electrode has a gate length L and a gate width $W_1$, said second gate electrode has a gate length L and a gate width $W_2$;

applying a negative fixed voltage to said first gate electrode and said second gate electrode;

measuring an accumulation capacitance per unit width of said first device $C_{acc1}$ and an accumulation capacitance per unit width of said second device $C_{acc2}$, wherein said $C_{acc1}$ and said $C_{acc2}$ are expressed as a first equation and a second equation, $$C_{acc1} = 2 \times C_{ov} + 2 \times C_f + (C_{off}/W_1)$$

$$C_{acc2} = 2 \times C_{ov} + 2 \times C_f + (C_{off}/W_2)$$

where $C_{ov}$ is a gate-to-drain overlap capacitance per unit width,
$C_f$ is a fringing capacitance per unit width,
$C_{off}$ is a deviation capacitance from a measuring apparatus;

and solving said first equation and said second equation to obtain said $C_{ov}$ and said $C_{off}$.

2. The method according to claim 1, wherein a gate-to-drain overlap length $L_{ov}$ of said first device and said second device can be obtained by putting said $C_{ov}$ into a third equation, $$L_{ov} = (H_{ox} \times C_{ov})/\epsilon_{oxide}$$

where $H_{ox}$ is a height of a gate oxide layer of said first device and said second device and $\epsilon_{ox}$ is a field of said gate oxide of said first device and said second device.

3. A method for measuring an effective channel length during a capacitance-voltage (C-V) method, said method comprising:

providing a first device comprising a first gate electrode, a first source and a first drain, a second device comprising a second gate electrode, a second source and a second drain, wherein said first gate electrode has a gate length L and a gate width W, said second gate electrode has a gate length L and a gate width W/2;

applying a negative fixed voltage to said first gate electrode and said second gate electrode;

measuring an accumulation capacitance per unit width of said first device $C_{acc1}$ and an accumulation capacitance per unit width of said second device $C_{acc2}$, wherein said $C_{acc1}$ and said $C_{acc2}$ are expressed as a first equation and a second equation, $$C_{acc1} = 2 \times C_{ov} + 2 \times C_f + (C_{off}/W)$$

$$C_{acc2} = 2 \times C_{ov} + 2 \times C_f + (2C_{off}/W)$$

where $C_{ov}$ is a gate-to-drain overlap capacitance per unit width,
$C_f$ is a fringing capacitance per unit width,
$C_{off}$ is a deviation capacitance from a measuring apparatus;

solving said first equation and said second equation to obtain said $C_{ov}$ and said $C_{off}$; and calculating a gate-to-drain overlap length $L_{ov}$ of said first device and said second device by putting said $C_{ov}$ into a third equation, $$L_{ov} = (H_{ox} \times C_{ov})/\epsilon_{oxide}$$

where $H_{ox}$ is a height of a gate oxide layer of said first device and said second device and $\epsilon_{ox}$ is a field of said gate oxide of said first device and said second device.

* * * * *